United States Patent [19]

Lapetina et al.

[11] Patent Number: 4,864,179

[45] Date of Patent: Sep. 5, 1989

[54] TWO-DIMENSIONAL PIEZOELECTRIC TRANSDUCER ASSEMBLY

[75] Inventors: Robert A. Lapetina; Gordon L. Snow; David P. Baird, all of Salt Lake City, Utah

[73] Assignee: Edo Corporation, Western Division, Salt Lake City, Utah

[21] Appl. No.: 126,161

[22] Filed: Nov. 27, 1987

Related U.S. Application Data

[63] Continuation-in-part of Ser. No. 917,711, Oct. 10, 1986, which is a continuation of Ser. No. 661,082, Oct. 15, 1984, abandoned.

[51] Int. Cl.[4] .............................................. H01L 41/08

[52] U.S. Cl. .................................... 310/337; 310/334; 310/359; 310/366; 367/155; 367/180

[58] Field of Search ............... 310/334, 338, 345, 347, 310/358, 359, 367, 340; 367/153–155, 165, 166, 180

[56] References Cited

U.S. PATENT DOCUMENTS

| | | | |
|---|---|---|---|
| 2,768,364 | 10/1956 | Camp | 310/334 X |
| 3,582,691 | 6/1971 | Sonderegger | 310/338 |
| 4,233,477 | 11/1980 | Rice et al. | 310/334 X |
| 4,656,384 | 4/1987 | Magori | 310/334 |
| 4,677,337 | 6/1987 | Kleinschmidt | 310/334 |

*Primary Examiner*—Mark O. Budd
*Attorney, Agent, or Firm*—Thorpe, North & Western

[57] ABSTRACT

A piezoelectric transducer assembly for producing sonar signals for transmission underwater and for detecting reflected sonar signals. The assembly includes a two-dimensional generally planar array of piezoelectric elements disposed in an elastomer casing. The elements are coupled by way of conductors to electronic circuitry which produces electrical signals for stressing the piezoelectric elements and which processes electrical signals produced by the piezoelectric element in response to reflected sonar signals. The piezoelectric elements are closely packed and are selected to have low cross-coupling characteristics. At least some of the elements are oriented so that their axes of polarization are generally perpendicular to the plane of the array.

15 Claims, 2 Drawing Sheets

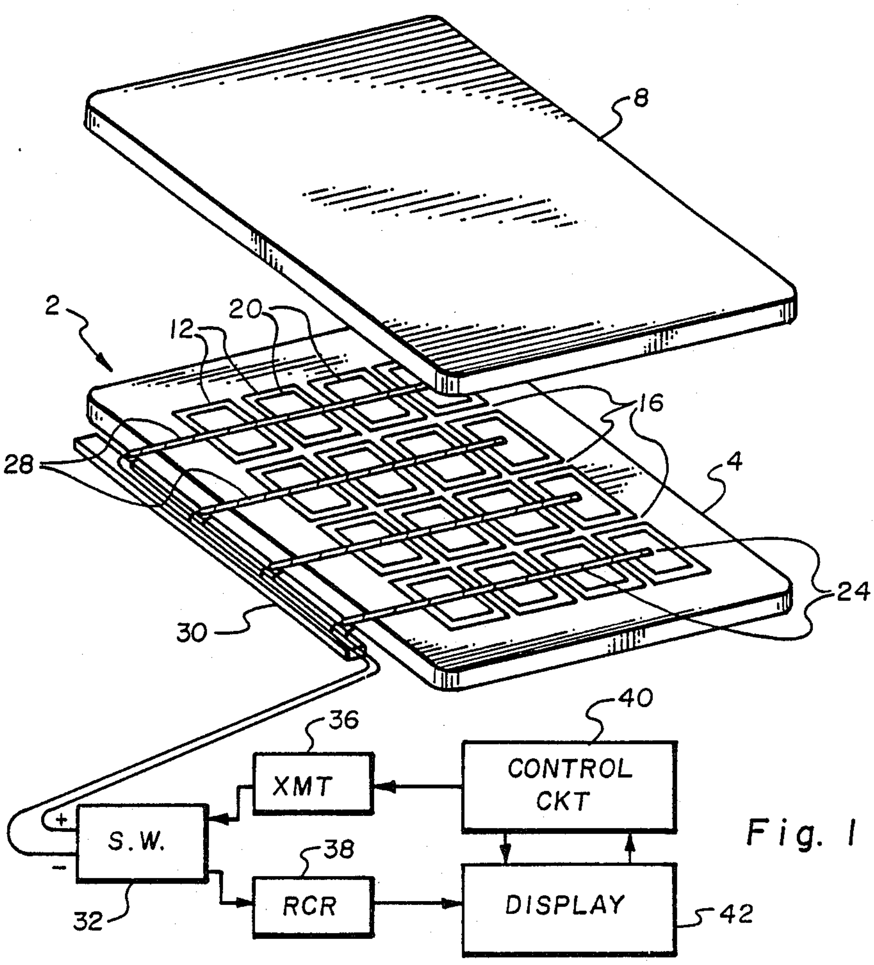
Fig. 1
Fig. 2
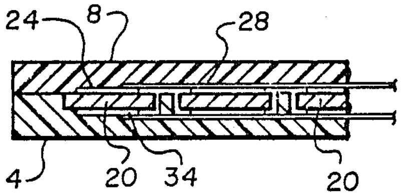

TWO-DIMENSIONAL PIEZOELECTRIC TRANSDUCER ASSEMBLY

BACKGROUND OF THE INVENTION

This is a continuation-in-part application of Ser. No. 06/917,711, filed Oct. 10, 1986, which was a continuation application of Ser. No. 06/661,082, filed Oct. 15, 1984, now abandoned.

This invention relates to a piezoelectric transducer assembly having large arrays of piezoelectric elements arranged so as to cancel or compensate for the effects of distortion forces.

Piezoelectric elements, primarily crystals and ceramics, are employed in a variety of devices including crystal microphones, ultrasonic devices, accelerometers and oscillators. One of the most common uses of piezoelectric elements is in underwater sonar equipment in which a piezoelectric sonar transducer is stimulated by electrical signals to emit sonar signals which radiate out from the transducer. The sonar signals are reflected from underwater objects and the reflected signals are detected by the transducer which produces electrical signals carrying information about the underwater objects.

Transducers typically used in underwater sonar equipment consist of either a single crystal or ceramic element or an array of elements.

It has been recognized that for long range sonar applications the use of very large contiguous arrays with a high packing density have significant performance advantages over discreet element arrays. Sonar arrays are adversely affected by noise generated by turbulent boundary layer effects and/or acceleration of the array's sensors resulting from the motion of the vehicle through the water. Arrangements which would minimize these adverse effects of array movement through the media would enhance overall sonar system performance significantly. Currently proposed systems utilizing planar arrays, however, typically suffer from sensitivity to the above-noted turbulence and acceleration generated noise, or require complex and thus costly structures to overcome or be insensitive to the noise.

SUMMARY OF THE INVENTION

It is an object of the invention to provide a two-dimensional piezoelectric transducer assembly which is relatively insensitive to movement of the array and to turbulence caused noise.

It is also an object of the invention to provide such an assembly which is simple in construction and easy to manufacture.

It is a further object of the invention to provide a piezoelectric transducer which is substantially immune to high pressures.

It is an additional object of the invention to provide a generally planar array composed of piezoelectric elements which can be assembled in extremely high density arrays to take advantage of the superior sonar performance resulting from more complete noise integration across the array face.

The above and other objects of the invention are realized in an illustrative embodiment of piezoelectric transducer assembly which includes a two-dimensional array of piezoelectric elements held in place in an elastomer encasement and having a generally flat profile. Each element has opposing surface areas and is polarized in a direction generally perpendicular to the opposing surface areas. At least some of the elements in the array are arranged so that their axes of polarization are oriented transversely of the plane of the array and advantageously, differently from the axes of polarization of other of the elements. Flexible conductors or conductive coatings provided to extend through the encasement into contact with the elements for carrying externally generated electrical signals to the elements to stress the elements, and for carrying to a signal processor or other utilization device electrical signals produced by the piezoelectric elements when the elements are stressed.

A variety of materials might be used for the encasement including polyurethane, polyethelene, neoprene rubber, etc., without the need for mechanical isolation of the individual piezoelectric elements.

BRIEF DESCRIPTION OF THE DRAWINGS

The above and other objects, features and advantages of the invention will become apparent from a consideration of the following detailed description presented in connection with the accompanying drawings in which:

FIG. 1 shows a perspective, exploded view of a planar piezoelectric transducer assembly made in accordance with the principles of the present invention;

FIG. 2 is a side, fragmented cross-sectional view of the piezoelectric transducer assembly of FIG. 1.

DETAILED DESCRIPTION

Figure 3:
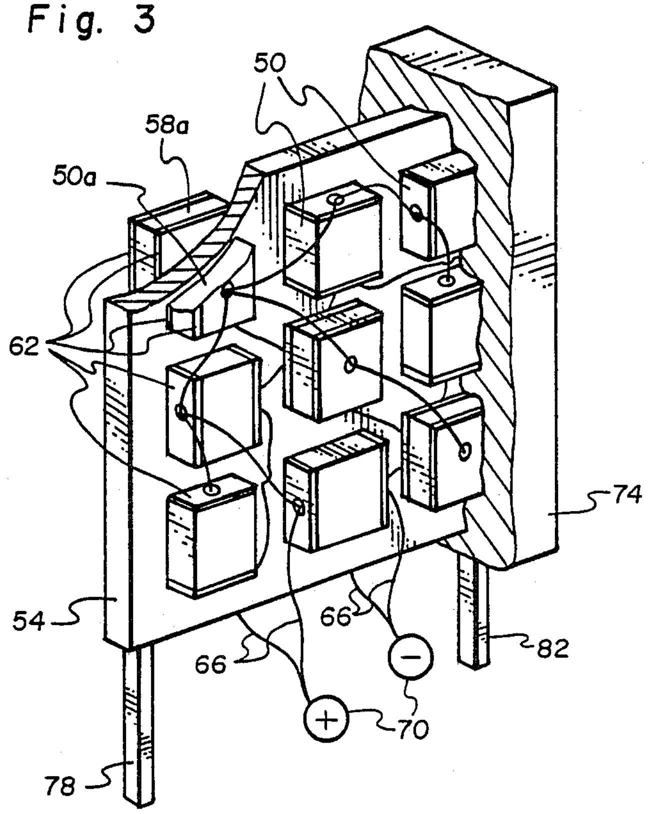
FIG. 3 shows a perspective, partially cut-away view of a two-array piezoelectric transducer assembly, also made in accordance with the principles of the present invention.

Referring to FIG. 1, there is shown an illustrative embodiment of a two-dimensional planar piezoelectric transducer assembly which includes a two-piece housing or casing 2 having a base section 4 and a cover section 8. Both sections are made of a resilient material such as polyurethane, polyethelene, neoprene rubber, etc. When the cover section 8 is placed over and secured to the base section 4, the casing will present a generally flat profile as best seen in FIG. 2. The cover section 8 may be secured to the base section 4 by a suitable bonding agent such as polyurethane. The casing is formed to be generally square, but could take other shapes such as rectangular, circular, triangular, etc. Also, the casing could be a single, unitary structure formed or molded about the piezoelectric elements (to be discussed momentarily) during manufacturing and not including a separate base and cover.

Formed in the base section 4 of the casing are a plurality of generally rectangular compartments 12. These compartments are formed to be closely packed and nested in the manner shown in FIG. 1 to provide precise spacing and alignment of piezoelectric elements. Adjacent compartments are separated by thin walls 16 integrally formed in the base section 4. Alternatively, a single large hollow or compartment may be formed in the base section 4 and then the piezoelectric elements (to be discussed momentarily) positioned in the hollow, separated from one another and held in place by an adhesive.

A plurality of piezoelectric elements 20, having low cross-coupling characteristics, are also provided, with each piezoelectric element being placed in a different one of the compartments and held in place by an adhesive. The piezoelectric elements 20 are formed to fit snugly in each compartment and thus, for the embodiment of FIG. 1, the elements are shown as having a generally rectangular shape to conform to the shape of the compartments. The elements 20 have a thickness which is greater than the depth of the compartments, such thickness being about the same as or less than the length and width of the elements.

The elements may be oriented in various directions relative to the axes of polarization so as to minimize the adverse effects of the sonar system performance caused by turbulence and acceleration forces on the array when installed on a vessel or vehicle. In particular, the elements may be oriented so that signals produced as a result of acceleration, turbulence, internal distortions, etc. will tend to cancel thus allowing detection of small signals produced from distant or low intensity sound sources. These orientations will be discussed later.

Thin conductive films 24 are placed on the upper and lower surfaces of each of the piezoelectric elements 20 (advantageously during manufacture of the elements) to enable poling of the elements during manufacture and to serve as electrodes for applying (or collecting) electrical signals to (from) the elements. Such films could be any suitable conductive material such as silver, a silver alloy, etc.

The piezoelectric elements 20 are selected to possess low cross-coupling to thereby reduce response in unwanted cross-coupling modes of operation and enable use of the elements over a wide band of frequencies without significant sensitive degradation. Suitable piezoelectric material for achieving this characteristic include lead mataniobate, polyvinylidene diflouride, lead titanate, among others. Use of these materials can be made without the necessity of encapsulating or isolating the individual elements in separate housings, thereby permitting very close spacing of the elements and enhancing the area averaging effects of the array.

Conductive strips of material 28 are placed in contact with each of the conductive films 24 on the upper surfaces of the piezoelectric elements 20, with conductive strips 28 extending through the casing to a bus 30 which is coupled to a transmit/receive switch 32. Conductive strips of material 34 (see FIG. 2) are placed in contact with conductive films positioned on the bottom surfaces of each of the piezoelectric elements 20 to extend through the casing also to the bus 30. The conductive strips 28 and 34 could advantageously be strips of silver, copper, etc., held in contact with the conductive films by spot welding, soldering or conductive adhesive. Alternatively, the conductive strips could be strips of flexible elastomer containing conductive (e.g. silver) particles or flakes. This latter arrangement would provide desired flexibility if required.

An alternative to the two-piece housing or casing 2 of FIG. 1 would be a one-piece housing made, for example, by first supporting the piezoelectric elements, connecting wires, etc., in the desired configuration (using suitable tooling fixtures), and then encapsulating the entire array in the encasement material.

The circuitry for producing electrical signals to stress the piezoelectric elements 20, and for detecting the occurrence of stress in the elements includes, in addition to the transmit/receive switch 32, a transmitter 36 and receiver and signal processor 38 both connected to the switch 32, a control circuit 40 connected to the transmitter 36, and a display unit 42 connected to the control circuit 40 and receiver and signal processor 38. The control circuit 40, which might illustratively be a microprocessor, signals the transmitter 36 to apply electrical signals via the transmit/receive switch 32 to the piezoelectric elements 20 to stress the elements. The piezoelectric elements 20 are thus caused to produce, for example, sonar signals for underwater transmission. Reflected sonar signals intercepted by the piezoelectric elements 20 stress the elements and cause them to produce electrical signals which are applied via the switch 32 to the receiver and signal processor 38. The receiver and signal processor 38 process these signals and then signals the display unit to display information representing the location and shape, for example, of underwater objects from which the sonar signals are reflected. The circuitry described is conventional, shown only for illustrative purposes, and does not form any part of the invention.

As alluded to earlier, it is important that "self" noise of the sonar array be as low as possible. One of the major sources of self noise in underwater sonar arrays is the flow noise of the water media passing over the face of the transducer array (usually referred to as turbulent boundary layer noise, or TBL noise). This source of noise can be reduced significantly by forming large arrays of contiguous elements which integrate the TBL noise over the entire length and/or width of the array. The self noise reduction is related to the size of the array and, the number and spacing of the elements in the array. When dealing with sonar arrays operating at low frequencies, the array size should be from approximately 10 feet to several thousand feet. Because of this, it becomes prohibitive in cost to consider packaging individually isolated elements in a high density configuration. In the past, large arrays have been produced by widely spacing elements and this resulted in lower cost but also severely degraded performance. The present invention overcomes this problem by allowing close packaging of a large number of elements in a simple, cost effective manner.

A second major source of array self noise is that caused when the vessel and thus the array are accelerated. The frequency of these acceleration forces are often very close to those target frequencies which are to be detected. The noise created by acceleration forces is large compared to the signals to be detected from remote targets—often hundreds or thousands of times larger than the target signals. With the present invention, the individual elements may be closely packed and physically oriented so that acceleration generated signals on adjacent elements can be substantially reduced or cancelled. In addition, due to the large number of elements, many axes of acceleration can be addressed rather than just the one or two axes normally addressed in conventional transducer arrays.

In order to obtain the desired large array of piezoelectric elements, many of the assemblies shown in FIG. 1 could be arranged together to form a large, generally planar array of elements. With such an arrangement, all the piezoelectric elements, even though in different encasements, would be energized and monitored by the same circuitry. The number of elements in each assembly (there are sixteen elements in the FIG. 1 assembly) would advantageously be about four or more.

The piezoelectric elements would advantageously have widths and lengths of between about ⅛ of an inch and several inches, and thicknesses of between about 1/100 of an inch and 1 inch, and would be spaced apart by about 1/16 of an inch or more (or alternatively about ½ of a wavelength of the self noise which might be encountered). These dimensions facilitate ease of manufacture and piezoelectric poling. Of course, the smaller the piezoelectric element, the greater would be the noise reduction of the transducer array.

Employment of a flexible casing 2 for holding the piezoelectric elements serves to isolate and protect the piezoelectric elements 20 from shock, hydrostatic pressures, water and other fluids in which it would be used, and other external effects. With the generally flat profile of the transducer assembly, the assembly can be readily attached to flat mounting surfaces and to surfaces having shapes; which are other than planar and which may change over time.

FIG. 2 shows a side, fragmented, cross-sectional view of the transducer assembly of FIG. 1 including the base section 4 and cover section 8 of the casing, the piezoelectric elements 20, and a conductive strip 28 attached to the conductive films or electrodes 24 on the top surface of the piezoelectric elements, and a conductive strip 34 attached to the conductive films or electrodes on the bottom surface of the elements. With the electrodes 24 being positioned generally parallel to the plane of the array as shown, all the elements 20 are poled in a direction perpendicular to the plane of the array. However, it has been found that orienting the poling axes of some of the elements differently from the orientation of the poling axes of other of the elements aids in cancelling and reducing the otherwise deleterious effects of self noise on the array of elements For example, each element could be positioned so that its poling axis is oriented in a direction at right angles to the poling axes of the next adjacent elements. Such positioning is shown for the array of piezoelectric elements of FIG. 3, to next be discussed.

In FIG. 3, a two-dimensional, two array piezoelectric transducer assembly is shown. One array of piezoelectric elements 50 is mounted (by a suitable adhesive such as polyurethane) on one side of a center, nonconductive mounting plate 54, and the other array of elements 58 (only one element of which is shown in FIG. 3) is mounted on the other side of the plate, generally in parallel with the one array. Thin conductive films or electrodes 62 are placed on opposing surfaces of each of the piezoelectric elements to thus define the poling axis (or axis of polarization) of each element. With the configuration of FIG. 3, the axis of polarization of each element is different from the axes of polarization of the next vertically and horizontally adjacent elements. The axes of polarization of each pair of elements positioned oppositely from one another on each side of the plate 54, however, are oriented in the same direction. For example, the poling axes of elements 50*a* and 58*a* are perpendicular to the plate 54, the poling axes of the next horizontally adjacent elements are oriented vertically, the poling axes of the pair of elements located vertically below elements 50*a* and 58*a* are oriented horizontally, etc. Of course, conductive wires or strips 66 connect the electrodes 62 to appropriate poling circuitry represented by voltage sources 70.

The two arrays of elements 50 and 58 and the mounting plate 54 are encapsulated in an elastomer material 74, such as polyurethane, polyetheiene, neoprene rubber, etc. Support legs and 82 extend from the plate 54, through the elastomer 74 to enable mounting the legs to an appropriate support structure on a vessel or vehicle.

In addition to the noise cancellation and integration benefits of orienting the poling axes of adjacent piezoelectric elements at right angles to one another, noise reduction benefits are also obtained by mounting the elements on opposite sides of a mounting plate as in FIG. 3. For example, acceleration forces acting on the assembly of FIG. 3 in a direction perpendicular to the planes of the arrays 50 and 58 would tend to compress one of the arrays against the plate 54 and place the other array under tension. Since corresponding electrodes of the piezoelectric elements of the two arrays are joined together electrically, the effects of the compressive forces and tension forces would tend to be cancelled.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A piezoelectric transducer assembly capable of reducing acceleration and fluid flow boundary noise comprising a two-dimensional closely packed, generally planar array of piezoelectric element means, each element means having one axis most sensitive to distortion forces including acceleration, and two other axes, orthogonal to said one axis and to each other, which are less sensitive to distortion forces, wherein at least some of the element means are positioned so that their most sensitive axes are oriented in a direction different from that in which the most sensitive axes of the remaining element means are oriented, an encasement for holding the array of element means in fixed relationship, conductor means for carrying electrical signals to the element means to stress the element means along poling axes, and cause them to produce sonar signals, and for carrying electrical signals away from the element means when the element means are stressed along the poling axes by received sonar signals, the poling axes of the element means being selected to coincide with the most sensitive axes, a first set of said element means being oriented so that their poling axes are generally at right angles to the plane of the array, a second set of the element means being oriented so that their poling axes generally lie in the plane of the array, and a third set of the element means being oriented so that their poling axes are generally at right angles of the poling axes of the first and second set of element means, the element means of each set being dispersed among the element means of every other set, and each element means being positioned so that its poling axes is oriented in a direction different from the direction of orientation of the poling axes of the next adjacent element means in the array, wherein, said poling axes orientations function to cause electrical signals generated by the element means receipt of signals which are caused by acceleration and fluid flow boundary noises, to cancel each other out.

2. A transducer assembly as in claim 1 wherein the poling axes of the element means are selected to coincide with the most sensitive axes, and wherein at least some of the element means are oriented so that their poling axes are generally at right angles to the plane of the array.

3. A transducer assembly as in claim 1 wherein the element means are spaced apart a distance of about one-sixteenth of an inch or less.

4. A piezoelectric transducer assembly capable of reducing acceleration and fluid flow boundary noise comprising a two-dimensional closely packed, generally planar array of piezoelectric element means, each element means having one axis most sensitive to distortion forces including acceleration, and two other axes, orthogonal to said one axis and to each other, which are less sensitive to distortion forces, wherein at least some of the element means are positioned so that their most sensitive axes are oriented in a direction different from that in which the most sensitive axes of the remaining element means are oriented, an encasement for holding the array of element means in fixed relationship, conductor means for carrying electrical signals to the element means to stress the element means along poling axes, and cause them to produce sonar signals, and for carrying electrical signals away from the element means when the element means are stressed along the poling axes by received sonar signals, the poling axes of the element means being selected to coincide with the most sensitive axes, a first set of said element means being oriented so that their poling axes are generally at right angles to the plane of the array, a second set of the element means being oriented so that their poling axes generally lie in the plane of the array, and a third set of the element means being oriented so that their poling axes are generally at right angles to the poling axes of the first and second sets of element means, element means of each set being dispersed among the elements of every other set, and an elastomer material carried in the encasement to surround and mechanically isolate the element means from one another, wherein, said poling axes orientations function to cause electrical signals generated by the element means receipt of signals which are caused by acceleration and fluid flow boundary noises, to cancel each other out.

5. A transducer assembly as in claim 4 wherein the elastomer material is polyurethane.

6. A transducer assembly as in claim 4 wherein the elastomer material is polyethelene.

7. A transducer assembly as in claim 4 wherein the poling axes of the element means are selected to coincide with the most sensitive axes, and wherein at least some of the element means are oriented so that their poling axes are generally at right angles to the plane of the array.

8. A transducer assembly as in claim 4 wherein the element means are spaced apart a distance of about one-sixteenth of an inch or less.

9. A piezoelectric transducer assembly capable of reducing acceleration and fluid flow boundary noises comprising a center, nonconductive mounting plate, first and second generally parallel, two-dimensional, closely packed arrays of piezoelectric element means having low cross-coupling characteristics, with the first array being mounted on one side of the plate and the second array being mounted on the other side of the plate, each element means of the arrays including opposing surface areas and each being polarized in a direction generally perpendicular to the element means's surface areas, wherein at least some of the element means are positioned so that their axes of polarization are oriented transversely of the plate, an encasement in which the plate and arrays are disposed, a plurality of electrodes disposed on said opposing surface areas of the piezoelectric elements means, and conductor means coupled to the electrodes for carrying electrical signals to the element means to stress the element means along axes of polarization and cause them to produce solar signals, and for carrying electrical signals away from the element means when the element means are stressed by received sonar signals, wherein, said poling axes orientation function to cause electrical signals generated by the element means receipt of signals which are caused by acceleration and fluid flow boundary noises, to cancel each other out.

10. A transducer assembly as in claim 9 wherein said encasement is made of an elastomer material adapted to mechanically isolate the element means from one another.

11. A transducer assembly as in claim 10 wherein said element means of each array are spaced apart from one another about one-sixteenth of an inch or less.

12. A transducer assembly as in claim 10 wherein each array includes a first set of element means oriented so that their axes of polarization are generally perpendicular to the plate, a second set of element means oriented so that their axes of polarization are generally parallel to the plate and at right angles to the axes of polarization of the first set, and a third set of element means oriented so that their axes of polarization are generally at right angles to the axes of polarization of the element means of both the first set and second set.

13. A transducer assembly as in claim 12 wherein the element means of each set of an array are intermingled among the element means of the other sets.

14. A transducer assembly as in claim 13 wherein each element means of each array is positioned so that its axis of polarization is oriented in a direction different from the direction of orientation of the axes of polarization of the next adjacent element means in said each array.

15. A transducer assembly as in claim 10 wherein each element means of the first array is located on the plate oppositely a corresponding element means of the second array, and wherein the axes of polarization of said oppositely positioned element means are generally parallel.

* * * * *